United States Patent
Lai et al.

(10) Patent No.: US 7,605,079 B2
(45) Date of Patent: Oct. 20, 2009

(54) MANUFACTURING METHOD FOR PHASE CHANGE RAM WITH ELECTRODE LAYER PROCESS

(75) Inventors: Erh Kun Lai, Longjing Shaing (TW); Chiahua Ho, Kaohsiung (TW); Yi Chou Chen, Cupertino, CA (US); Kuang Yeu Hsieh, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 454 days.

(21) Appl. No.: 11/382,799

(22) Filed: May 11, 2006

(65) Prior Publication Data
US 2007/0155172 A1    Jul. 5, 2007

Related U.S. Application Data

(60) Provisional application No. 60/742,448, filed on Dec. 5, 2005.

(51) Int. Cl.
*H01L 21/44* (2006.01)
(52) U.S. Cl. ........................ 438/666; 438/128; 438/667; 438/652
(58) Field of Classification Search ................ 438/666, 438/669, 672, 673, 674, 675, 652, FOR. 368, 438/FOR. 426, FOR. 196, 128, 129, 253, 438/254, 396, 397, 667, 618, 622; 257/E21.614, 257/202, 208, 204, 206, 209, 211, 390, 306, 257/397, 773, 774
See application file for complete search history.

(56) References Cited

U.S. PATENT DOCUMENTS 3,271,591 A    9/1966   Ovshinsky
3,530,441 A    9/1970   Ovshinsky (Continued)

FOREIGN PATENT DOCUMENTS

WO    WO 00/45108 A1    8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Thao X Le
*Assistant Examiner*—Thanh Y Tran
(74) *Attorney, Agent, or Firm*—Haynes Beffel & Wolfeld LLP

(57) ABSTRACT

A method for manufacturing a phase change memory device comprises forming an electrode layer. Electrodes are made in the electrode layer using conductor fill techniques that are also used inter-layer conductors for metallization layers, in order to improve process scaling with shrinking critical dimensions for metallization layers. The electrode layer is made by forming a multi-layer dielectric layer on a substrate, etching the multi-layer dielectric layer to form vias for electrode members contacting circuitry below, forming insulating spacers on the vias, etching through a top layer in the multi-layer dielectric layer to form trenches between the insulating spacers for electrode members contacting circuitry above, filling the vias and trenches with a conductive material using the metallization process. Thin film bridges of memory material are formed over the electrode layer.

25 Claims, 12 Drawing Sheets

U.S. PATENT DOCUMENTS

| | | |
|---|---|---|
| 4,599,705 A | 7/1986 | Holmberg et al. |
| 4,719,594 A | 1/1988 | Young et al. |
| 4,876,220 A | 10/1989 | Mohsen et al. |
| 5,166,096 A | 11/1992 | Cote et al. |
| 5,166,758 A | 11/1992 | Ovshinsky et al. |
| 5,177,567 A | 1/1993 | Klersy et al. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,805,563 B2 | 10/2004 | Ohashi |
| 6,815,704 B1 | 11/2004 | Chen |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 2004/0248339 A1 | 12/2004 | Lung |
| 2005/0215009 A1 | 9/2005 | Cho |
| 2006/0284157 A1* | 12/2006 | Chen et al. .................... 257/2 |
| 2006/0286709 A1* | 12/2006 | Lung et al. .................. 438/102 |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3$^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

MANUFACTURING METHOD FOR PHASE CHANGE RAM WITH ELECTRODE LAYER PROCESS

RELATED APPLICATION DATA

The present application claims the benefit of U.S. Provisional Patent Application No. 60/742,448; entitled MANUFACTURING METHOD FOR PHASE CHANGE RAM WITH ELECTRODE LAYER PROCESS, filed 5 Dec. 2005.

BACKGROUND OF THE INVENTION

1. Field of the Invention

The present invention relates to high density memory devices based on programmable resistive memory materials, including phase change based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using phase change materials as a programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000; and Chen, "Phase Change Memory Device Employing Thermally Insulating Voids", U.S. Pat. No. 6,815,704 B1, issued Nov. 9, 2004. Other techniques include formation of small electrodes for contact to larger bodies of phase change material, as described in Chiang et al., "Metal Structure for a Phase-Change Memory Device", U.S. Pat. No. 6,797,979 B2, issued Sep. 28, 2004.

Problems have arisen in manufacturing such devices with very small dimensions, and with variations in process that meets tight specifications needed for large-scale memory devices. It is desirable therefore to provide a memory cell structure having small dimensions and low reset currents, and a method for manufacturing such structure that meets tight process variation specifications needed for large-scale memory devices. It is further desirable to provide a manufacturing process and a structure, which are compatible with manufacturing of peripheral circuits on the same integrated circuit.

One structure for implementing very small phase change memory devices is described in co-pending U.S. patent application Ser. No. 11/155,067, filed 17 Jun. 2005 by Hsiang-Lan Lung and Shih-Hung Chen, entitled THIN FILM FUSE PHASE CHANGE RAM AND MANUFACTURING METHOD (Lung et al. application), which application is owned now, and at the time of invention by the same assignee as the present invention, and is hereby incorporated by reference as if fully set forth herein.

The structure described in the Lung et al. application consists of a thin film bridge of phase change material having small dimensions crossing from a first electrode to a second electrode separated by an insulating wall, where the first electrode and second electrode are formed in an electrode layer of the integrated circuit. It is desirable to provide manufacturing technique to efficiently implement the electrode layer for small dimension phase change bridge cells.

SUMMARY OF THE INVENTION

A phase change random access memory PCRAM device is described suitable for use in large-scale integrated circuits. Technology described herein includes a memory device comprising a first electrode having a top side, a second electrode having a top side and an insulating member between the first electrode and the second electrode. A thin film bridge comprising programmable resistive material crosses the insulating member, and defines an inter-electrode path between the first and second electrodes across the insulating member. The inter-electrode path across the insulating member has a path length defined by the width of the insulating member. For the purpose of illustration, the bridge can be thought of as having a structure like a fuse. For the phase change memory however, and unlike a fuse, the bridge comprises memory material having at least two solid phases that are reversible, such as a chalcogenide-based material or other related material, by applying a current through the material or applying a voltage across the first and second electrodes.

The volume of memory material subject of phase change can be very small, determined by the thickness of the insulating member (path length in the x-direction), the thickness of the thin film used to form the bridge (y-direction), and the width of the bridge orthogonal to the path length (z-direction). The thickness of the insulating member and the thickness of the thin film of memory material used to form the bridge are determined in embodiments of the technology by thin film thicknesses which are not limited by the lithographic processes used in manufacturing the memory cell. The width of the bridge can be smaller than a minimum feature size F that is specified for a lithographic process used in patterning the layer of material in embodiments of the present invention. In one embodiment, the width of the bridge is defined using photoresist trimming technologies in which a mask pattern is used to define a lithographical photoresist structure on the chip having the minimum feature size F, and the photoresist structure is trimmed by isotropic etching to achieve a feature size less than F. The trimmed photoresist structure is then used to lithographically transfer the more narrow pattern onto the layer of memory material. Also, other techniques can be used to form narrow lines of material in a layer on an integrated circuit. Accordingly, a phase change memory cell with simple structure achieves very small reset current and low power consumption, and is easily manufactured.

In embodiments of the technology described herein, an array of memory cells is provided. In the array, a plurality of electrode members and insulating members therebetween comprise an electrode layer on an integrated circuit. The electrode layer has a top surface. The corresponding plurality of thin film bridges across the insulating members between pairs of electrode members comprise memory elements on the top surface of the electrode layer. A current path from a first electrode in the electrode layer through a thin film bridge on the top surface of the electrode layer to a second electrode in the electrode layer is established for each memory cell in the array.

Circuitry below the electrode layer on integrated circuits described herein can be implemented using well understood technology for logic circuitry and memory array circuitry, such as CMOS technology. In one embodiment, an isolation device such as a transistor has a terminal beneath at least a second electrode in an electrode pair, and a conductor forms a connection between the terminal of the transistor and the second electrode for a memory cell in the array.

Also, in one array embodiment described herein, circuitry above the electrode layer includes a plurality of bit lines. In an embodiment having bit lines above the electrode layer that is described herein, electrode members in the electrode layer which act as an electrode ("second electrode" herein) for a memory cell are shared so that a single electrode member provides an electrode for two memory cells in a column of the array.

A method for manufacturing a memory device is also described. The method comprises forming an electrode layer on a substrate which comprises circuitry made using front-end-of-line procedures. Electrodes are made in the electrode layer using conductor fill techniques that are also used inter-layer conductors for metallization layers, in order to improve process scaling with shrinking critical dimensions for metallization layers.

In an embodiment of the manufacturing method, the electrode layer is made by a process based on forming a multi-layer dielectric layer on a substrate, and etching the multi-layer dielectric layer to form vias for electrode members contacting circuitry below. Then, insulating spacers are formed on the sidewalls of the vias. Next, a top layer in the multi-layer dielectric layer is removed between the insulating spacers to form trenches between vias separated from the vias by the insulating spacers. The trenches are used for formation of electrode members contacting circuitry above. Next, the vias and trenches are filled with a conductive material. The resulting structure is polished, removing a top surface of the conductive material to define first and second electrodes on either side of the insulating spacers, by chemical mechanical polishing or otherwise, to define the electrode layer, wherein the first and second electrodes and insulating spacers are exposed on the top surface and act as the insulating member, the first electrode, and the second electrode.

The conductive material comprises a first layer of a bulk conductor such as copper or copper alloys suitable for filling the vias and trenches, and a second layer of contact conductor such as TiN, suitable for contacting the phase change bridges. The process is compatible with conventional CMOS manufacturing techniques, simple, and easily scaled with shrinking critical dimensions due to Cu fill-in.

A method for manufacturing a memory device comprising programmable resistive material described herein includes forming circuitry in a substrate having a top surface, the circuitry including an array of contacts on the top surface of the substrate. A multilayer structure is formed on the substrate over the array of contacts. The multilayer structure includes at least a first dielectric fill layer, an etchstop layer on the first dielectric fill layer, and a second dielectric fill layer on the etchstop layer. Then, the multilayer structure is etched in a pattern including contact vias uncovering selected contacts in the array of contacts on the top surface of the substrate. Sidewall dielectric spacers are formed on sidewalls of the contact vias, and the multilayer structure is covered with a sacrificial material, filling the contact vias. The sacrificial material is selectively etched in a pattern including openings uncovering electrode regions and sidewall dielectric spacers on the multilayer structure, stopping near a top surface level of the second dielectric fill layer. Then the second dielectric fill layer is removed in the electrode regions, stopping on the etch stop layer, to form electrode trenches in the multilayer structure, and leaving the sidewall dielectric spacers on sides of the electrode trenches. Next, the sacrificial material is removed from the contact vias, uncovering said selected contacts and leaving the sidewall dielectric spacers between pairs of openings, the pairs including contact vias and electrode trenches. A conductive material filling the contact vias and electrode trenches is deposited to form a filled structure. The filled structure is etched back, removing some of the conductive material within the contact vias and electrode trenches to a level below tops of the sidewall dielectric spacers to form electrode recesses. The electrode recesses are filled with an electrode material selected for compatibility with the programmable resistive material to a level exposing respective top surfaces of sidewall dielectric spacers between pairs of electrodes, where the pairs of electrodes include conductive material within respective filled contact vias acting as first electrodes and filled electrode trenches acting as second electrodes, and providing a top surface of an electrode layer including an array of electrode pairs. An array of bridges of programmable resistive material is formed on the top surface of the electrode layer, the array of bridges including bridges for electrode pairs in the array of electrode pairs, contacting the respective first and second electrodes and extending across the respective top surfaces of sidewall dielectric spacers. The bridges define inter-electrode paths between the first and second electrodes across the insulating members having path lengths defined by the widths of the insulating members. A patterned conductive layer is formed over said bridges in electrical communication with said second electrodes in the array of electrode pairs.

Other aspects and advantages of the invention can be seen on review of the figures, the detailed specification and the claims which follow.

DETAILED DESCRIPTION

A detailed description of thin film fuse phase change memory cells, arrays of such memory cells, and methods for manufacturing such memory cells, is provided with reference to FIGS. 1-18.

Figure 1:
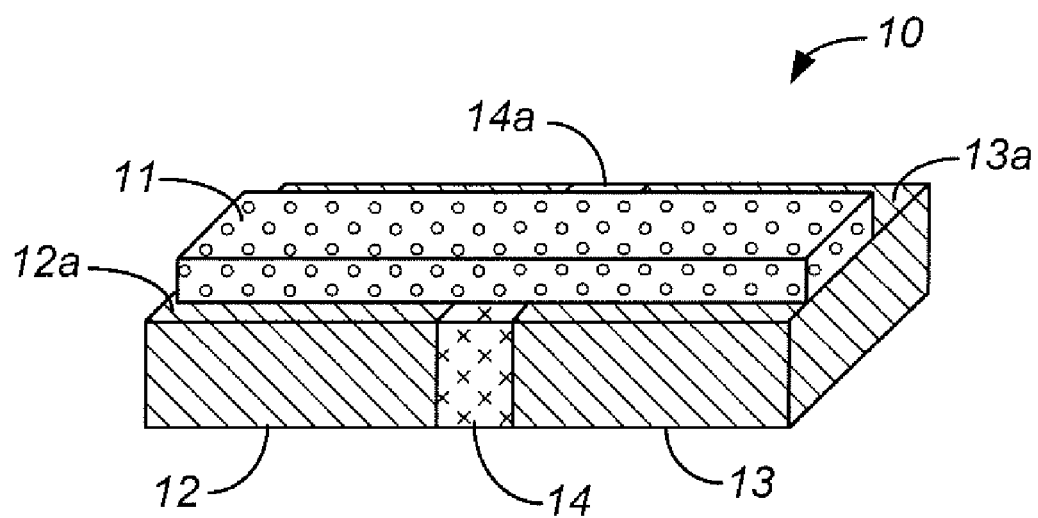
FIG. 1 illustrates an embodiment of a thin film bridge phase change memory element.

FIG. 1 illustrates a basic structure of a memory cell 10 including a bridge 11 of memory material on an electrode layer which comprises a first electrode 12, a second electrode 13, and an insulating member 14 between the first electrode 12 and the second electrode 13. As illustrated, the first and second electrodes 12, 13 have top surfaces 12a and 13a. Likewise the insulating member 14 has a top surface 14a. The top surfaces 12a, 13a, 14a of the structures in the electrode layer define a substantially planar top surface for the electrode layer in the illustrated embodiment. The bridge 11 of memory material lies on the planar top surface of the electrode layer, so that contacts between the first electrode and the bridge 11 and between the second electrode 13 and the bridge 11 are made on the bottom side of the bridge 11. In other embodiments, the top surface 14a of the insulating member is not co-planar with the electrodes, but rather protrudes upwardly so that the active region in the bridge is more distant from the electrode material.

Figure 2:
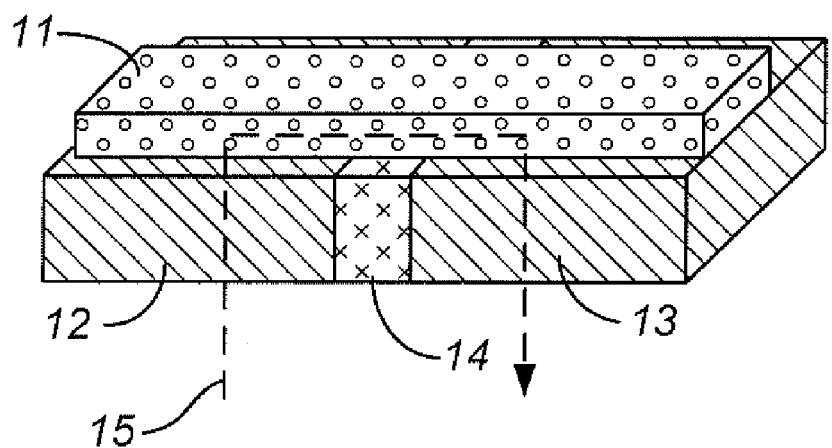
FIG. 2 illustrates a current path in a thin film bridge phase change memory element as shown in FIG. 1.

FIG. 2 shows a current path 15 between the first electrode 12, the bridge 11, and the second electrode 13 formed by the memory cell structure. Access circuitry can be implemented to contact the first electrode 12 and the second electrode 13 in a variety of configurations for controlling the operation of the memory cell, so that it can be programmed to set the bridge 11 in one of the two solid phases that can be reversibly implemented using the memory material. For example, using a chalcogenide-based phase change memory material, the memory cell may be set to a relatively high resistivity state in which at least a portion of the bridge in the current path is an amorphous state, and a relatively low resistivity state in which most of the bridge in the current path is in a crystalline state.

Figure 3:
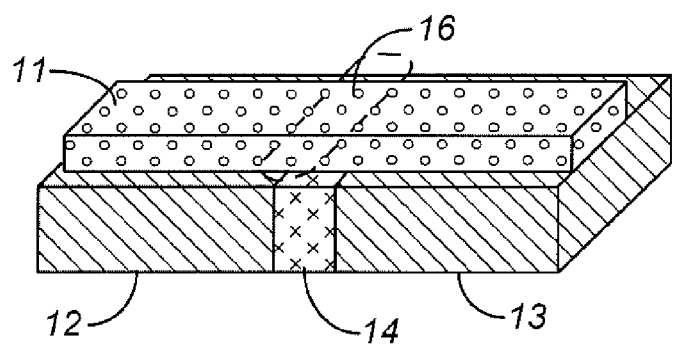
FIG. 3 illustrates an active region for phase changes in a thin film bridge phase change memory element as shown in FIG. 1.

FIG. 3 shows the active channel 16 in the bridge 11, where the active channel 16 is the region in which the material is induced to change between the at least two solid phases. As can be appreciated, the active channel 16 can be made extremely small in the illustrated structure, reducing the magnitude of current needed to induce the phase changes.

Figure 4:
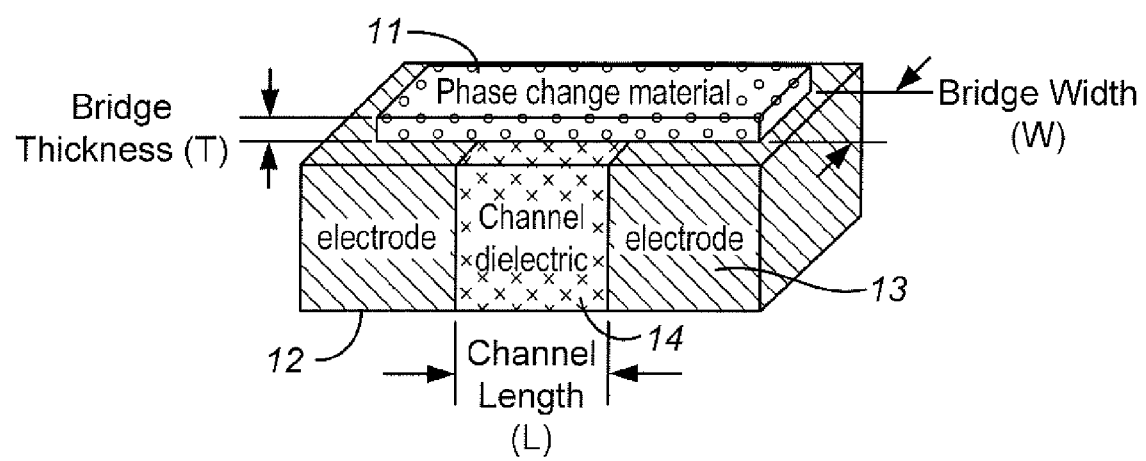
FIG. 4 illustrates dimensions for a thin film bridge phase change memory element as shown in FIG. 1.

FIG. 4 illustrates important dimensions of the memory cell 10. The length L (x-dimension) of the active channel is defined by the thickness of the insulating member 14 (called channel dielectric in the figure), between the first electrode 12 and the second electrode 13. This length L can be controlled by controlling the width of the insulating member 14 in embodiments of the memory cell. In representative embodiments, the width of the insulating member 14 can be established using a thin film deposition technique to form a thin sidewall dielectric on the side of an electrode stack. Thus, embodiments of the memory cell have a channel length L less than 100 nm. Other embodiments have a channel length L of about 40 nm or less. In yet other embodiments, the channel length is less than 20 nm. It will be understood that the channel length L can be even smaller than 20 nm, using thin-film deposition techniques such as atomic layer deposition and the like, according to the needs of the particular application.

Likewise, the bridge thickness T (y-dimension) can be very small in embodiments of the memory cell. This bridge thickness T can be established using a thin film deposition technique on the top surfaces of the first electrode 12, insulating member 14, and second electrode 13. Thus, embodiments of the memory cell have a bridge thickness T about 50 nm or less. Other embodiments of the memory cell have a bridge thickness of about 20 nm or less. In yet other embodiments, the bridge thickness T is about 10 nm or less. It will be understood that the bridge thickness T can be even smaller than 10 nm, using thin film deposition techniques such as atomic layer deposition and the like, according to the needs of the particular application, so long as the thickness is sufficient for the bridge performs its purpose as memory element, having at least two solid phases, reversible by a current or by a voltage applied across the first and second electrodes.

As illustrated in FIG. 4, the bridge width W (z-dimension) is likewise very small. This bridge width W is implemented in preferred embodiments, so that it has a width less than 100 nm. In some embodiments, the bridge width W is about 40 nm or less.

Embodiments of the memory cell include phase change based memory materials, including chalcogenide based materials and other materials, for the bridge 11. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys oft Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include Ge2Sb2Te5, GeSb2Te4 and GeSb4Te7. (Noboru Yamada, "Potential of Ge-Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x:y=0.5:0.5, or other compositions with x: 0~1; y: 0~1. CMR material that includes Mn oxide is alternatively used An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges 400° C. to 600° C. with an anneal time of less than 2 hours.

The thickness of CMR material depends on the design of cell structure. The CMR thickness of 10 nm to 200 nm can be used to be the core material. A buffer layer of YBCO (YBaCuO3, which is a type of high temperature superconductor material) is often used to improve the crystallized state of CMR material. The YBCO is deposited before the deposition of CMR material. The thickness of YBCO ranges 30 nm to 200 nm.

A third type of memory material are two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, they combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges 400° C. to 600° C. with an anneal time of less than 2 hours.

An alternative formation method uses PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post deposition annealing treatment in vacuum or in an $N_2$ ambient or $O_2/N_2$ mixed ambient is optionally performed to improve the oxygen distribution of metal oxide. The annealing temperature ranges 400° C. to 600° C. with an anneal time of less than 2 hours.

Yet another formation method uses oxidation by a high temperature oxidation system, such as furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges room temperature to 300° C., depending on the degree of plasma oxidation.

A fourth type of memory material is a polymer material, such as TCNQ [Is this acronym well known enough and sufficiently unique so that a full description is not required? Otherwise, I suggest these compounds are written out.] with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges room temperature to 300° C. with an anneal time of less than 1 hour.

Figure 5:
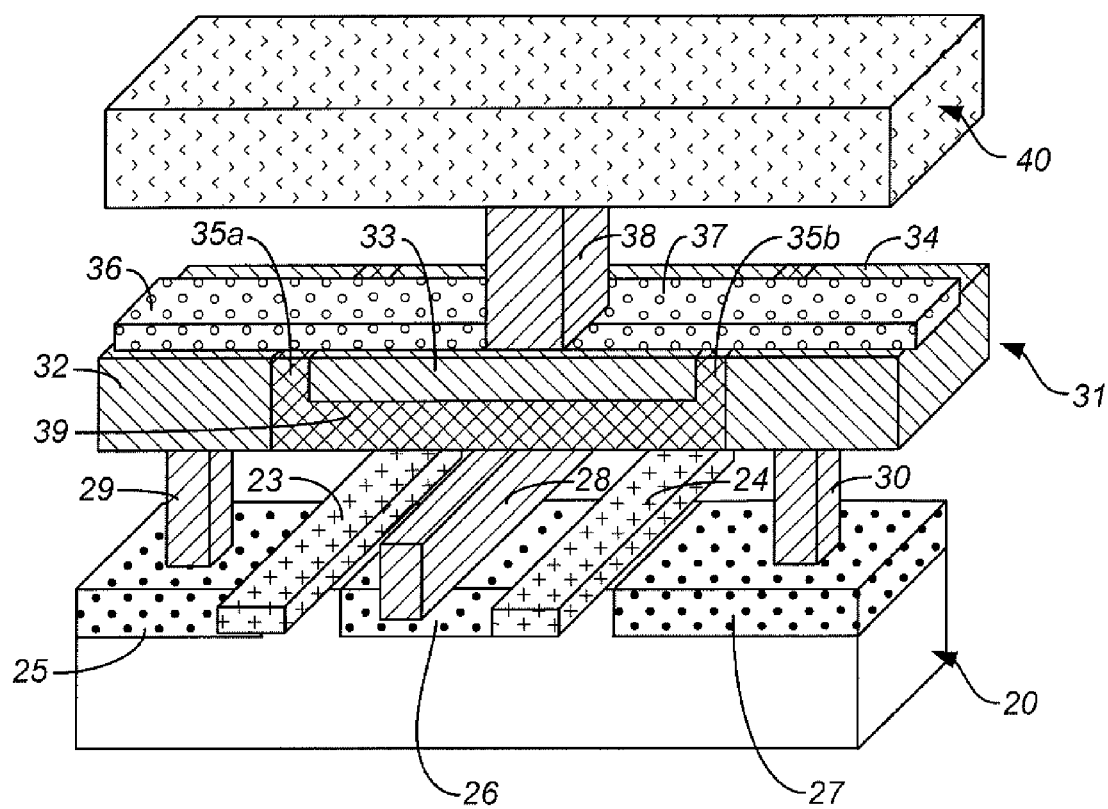
FIG. 5 illustrates a structure for a pair of phase change memory elements with access circuitry below an electrode layer and bit lines above the electrode layer.

FIG. 5 depicts a structure for PCRAM cells. The cells are formed on a semiconductor substrate 20. Isolation structures such as shallow trench isolation STI dielectrics (not shown) isolate pairs of rows of memory cell access transistors. The access transistors are formed by n-type terminal 26 acting as a common source region and n-type terminals 25 and 27 acting as drain regions in a p-type substrate 20. Polysilicon word lines 23 and 24 form the gates of the access transistors. A dielectric fill layer (not illustrated) is formed over the polysilicon word lines. The layer is patterned and conductive structures, including common source line 28 and plug structures 29 and 30 are formed. The conductive material can be tungsten or other materials and combinations suitable for the plug and lines structures. The common source line 28 contacts the source region 26, and acts as a common source line along a row in the array. The plug structures 29 and 30 contact the drain terminals 25 and 26, respectively. The fill layer (not shown), the common source line 28 and the plug structures 29 and 30, have a generally planar top surface, suitable for formation of an electrode layer 31.

The electrode layer 31 includes electrode members 32, 33 and 34, which are separated from one another by an insulating member including fences 35a and 35b formed for example by a sidewall process as described below, and base member 39. The base member 39 can be thicker than the fences 35a, 35b in embodiments of the structure, and separates the electrode member 33 from the common source line 28. For example the base member can be for instance, 80 to 140 nm thick while the fences are much narrower, as needed to reduce capacitive coupling between the source line 28 and the electrode member 33. The fences 35a, 35b comprise a thin film dielectric material on the sidewalls of electrode members 32, 34 in the illustrated embodiment, with a thickness at the surface of the electrode layer 31 determined by the thin film thickness on the sidewalls.

A thin film bridge 36 of memory material, such as GST, overlies the electrode layer 31 on one side traversing across the fence member 35a, forming a first memory cell, and a thin film bridge 37 of memory material, such as GST, overlies the electrode layer 31 on another side traversing across the fence member 35b, forming a second memory cell.

A dielectric fill layer (not illustrated) overlies the thin film bridges 36, 37. The dielectric fill layer comprises silicon dioxide, a polyimide, silicon nitride or other dielectric fill materials. In embodiments, the fill layer comprises a relatively good insulator for heat as well as for electricity, providing thermal and electrical isolation for the bridges. Tungsten plug 38 contacts the electrode member 33. A patterned conductive layer 40, comprising metal or other conductive material, including bit lines in an array structure, overlies the dielectric fill layer, and contacts the plug 38 to establish access to the memory cells corresponding to the thin film bridge 36 and the thin film bridge 37.

Figure 6:
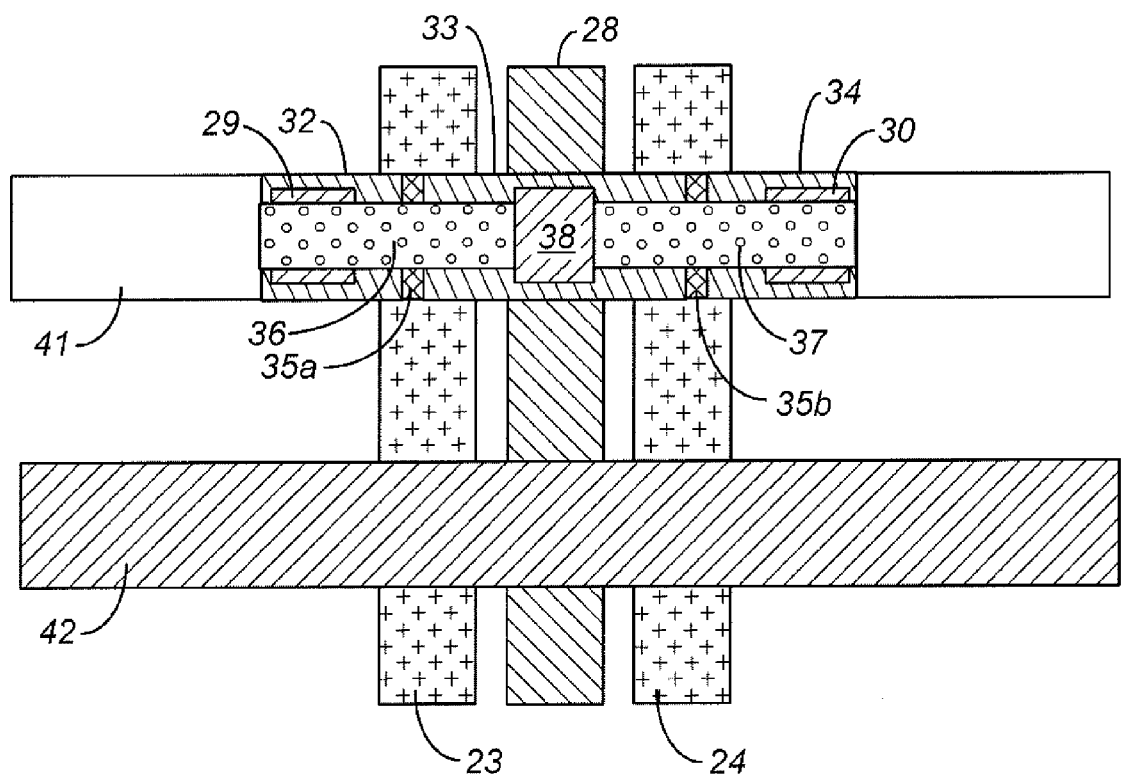
FIG. 6 shows a layout or plan view for the structure illustrated in FIG. 5.

FIG. 6 shows the structure above the semiconductor substrate layer 20 of FIG. 5 in layout view. Thus, the word lines 23 and 24 are laid out substantially parallel to the common source line 28, along those in an array of memory cells. Plugs 29 and 30 contact terminals of access transistors in the semiconductor substrate and the underside of electrode members 32 and 34 respectively. Thin film bridges 36 and 37 of memory material overlie the electrode members 32, 33 and 34, and the insulating fences 35a, 35b separating the electrode members. Plug 38 contacts the electrode member 33 between the bridges 36 and 37 and the underside of a metal bit line 41 (transparent in FIG. 6) in the patterned conductive layer 40. Metal bit line 42 (not transparent) is also illustrated in FIG. 6 to emphasize the array layout of the structure.

In operation, access to the memory cell corresponding with bridge 36 is accomplished by applying a control signal to the word line 23, which couples the common source line 28 via terminal 25, plug 29, and electrode member 32 to the thin-film bridge 36. Electrode member 33 is coupled via the contact plug 38 to a bit line in the patterned conductive layer 40. Likewise, access to the memory cell corresponding with bridge 37 is accomplished by applying a control signal to the word line 24.

It will be understood that a wide variety of materials can be utilized in implementation of the structure illustrated in FIGS. 5 and 6. For example, copper metallization can be used. Other types of metallization, including aluminum, titanium nitride, and tungsten based materials can be utilized as well. Also, non-metal conductive material such as doped polysilicon can be used. The inter-electrode fence members 35a, 35b may be silicon oxide, silicon oxynitride, silicon nitride, $Al_2O_3$, or other low K dielectrics. Alternatively, the inter-electrode insulating layer may comprise one or more elements selected from the group consisting of Si, Ti, Al, Ta, N, O, and C.

Figure 7:
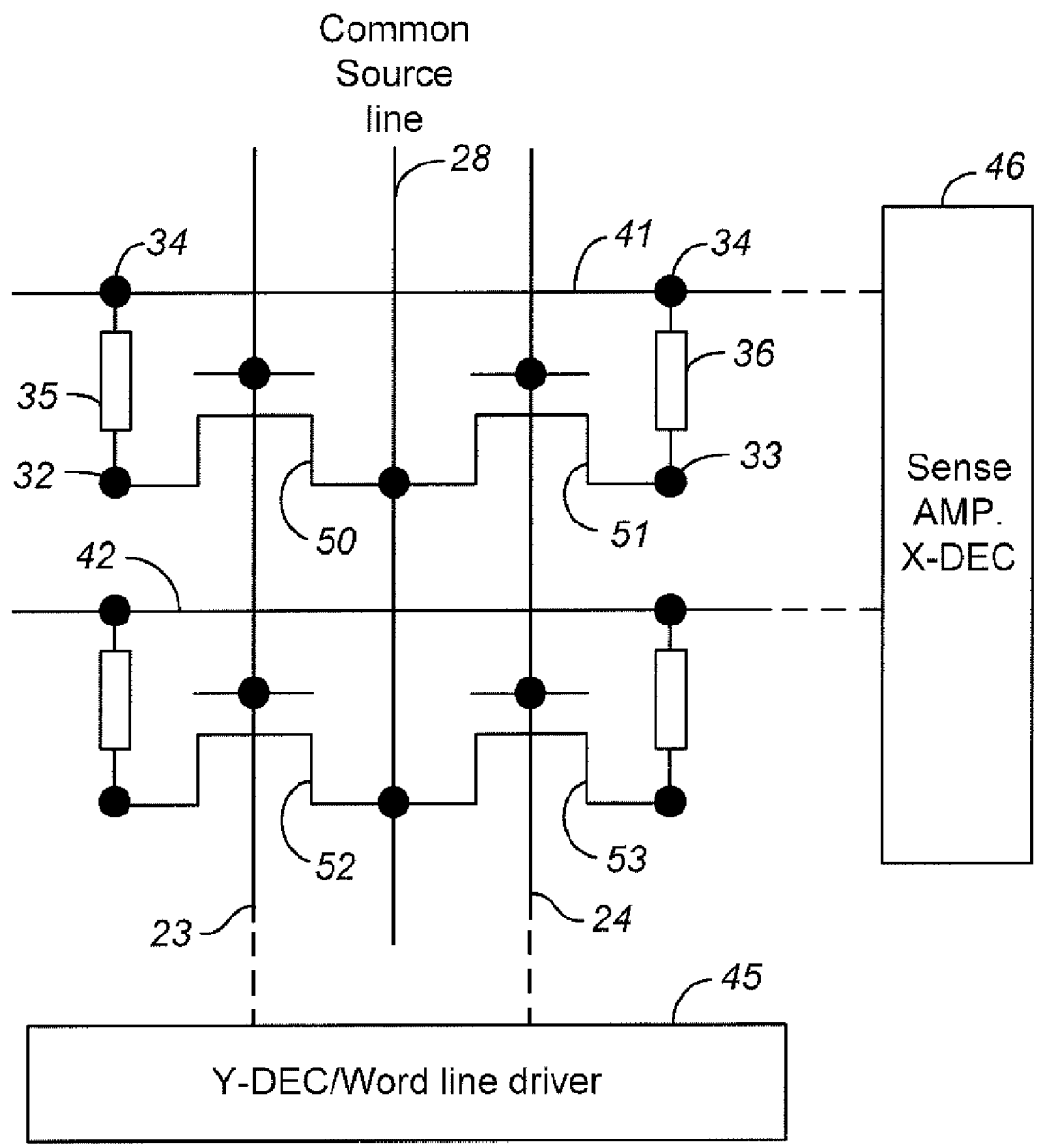
FIG. 7 is a schematic diagram for a memory array comprising phase change memory elements.

FIG. 7 is a schematic illustration of a memory array, which can be implemented as described with reference to FIGS. 5 and 6. Thus, reference numerals for elements of FIG. 7 match corresponding elements in the structure of FIGS. 5 and 6. In a schematic illustration of FIG. 7, the common source line 28, the word line 23 and the word line 24 are arranged generally parallel in the Y-direction. Bit lines 41 and 42 are arranged generally parallel in the X-direction. Thus, a Y-decoder and a word line driver in block 45 are coupled to the word lines 23, 24. An X-decoder and set of sense amplifiers in block 46 are coupled to the bit lines 41 and 42. The common source line 28 is coupled to the source terminals of access transistors 50, 51, 52 and 53. The gate of access transistor 50 is coupled to the word line 23. The gate of access transistor 51 is coupled to the word line 24. The gate of access transistor 52 is coupled to the word line 23. The gate of access transistor 53 is coupled to the word line 24. The drain of access transistor 50 is coupled to the electrode member 32 for bridge 36, which is in turn coupled to electrode member 34. Likewise, the drain of access transistor 51 is coupled to the electrode member 33 for bridge 36, which is in turn coupled to the electrode member 34. The electrode member 34 is coupled to the bit line 41. For schematic purposes, the electrode member 34 is illustrated at separate locations on the bit line 41. It will be appreciated that separate electrode members can be utilized for the separate memory cell bridges in other embodiments. Access transistors 52 and 53 are coupled to corresponding memory cells as well on line 42. It can be seen that the common source line 28 is shared by two rows of memory cells, where a row is arranged in the Y-direction in the illustrated schematic. Likewise, the electrode member 34 is shared by two memory cells in a column in the array, where a column is arranged in the X-direction in the illustrated schematic.

Figure 8:
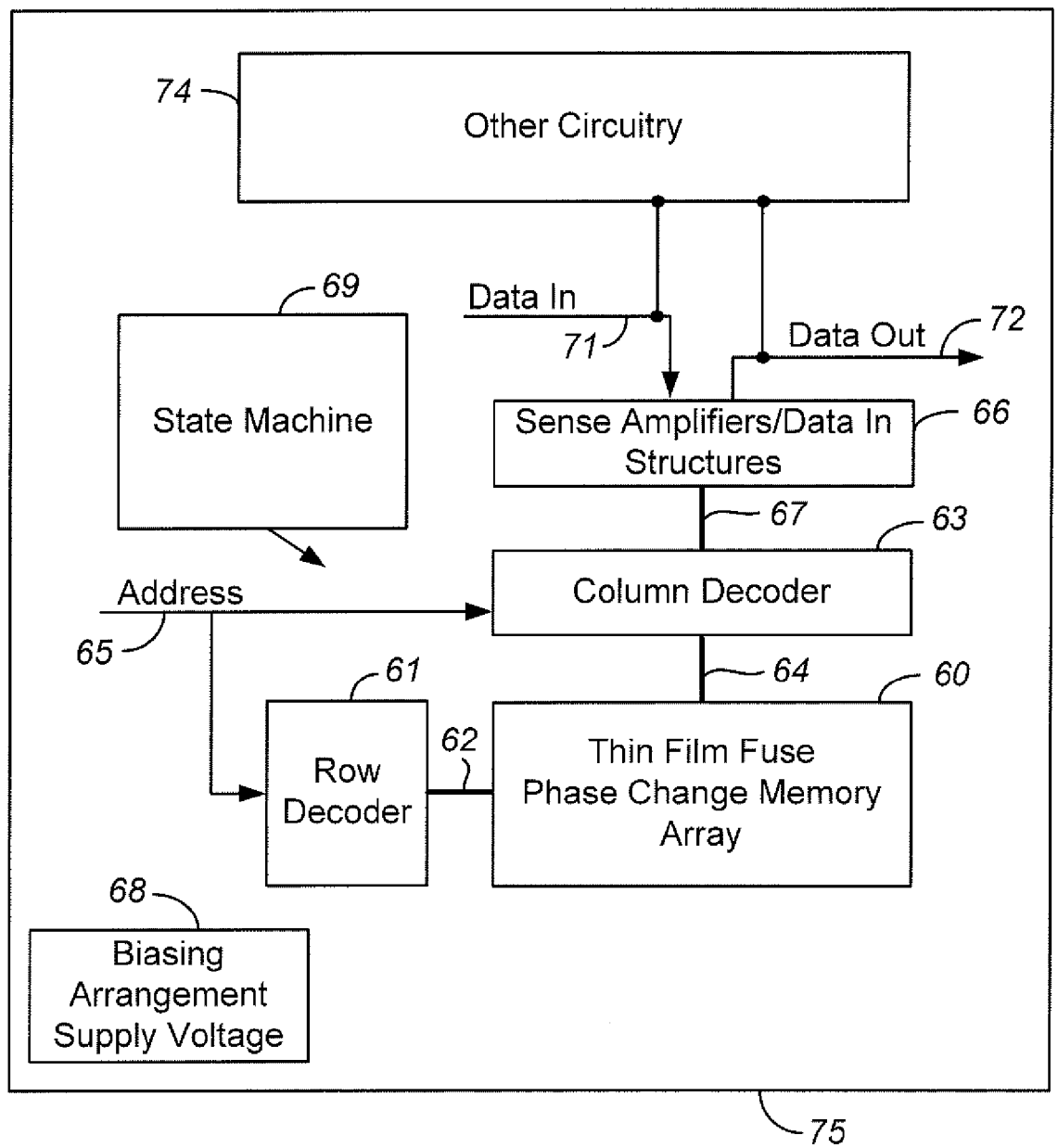
FIG. 8 is a block diagram of an integrated circuit device including a thin film fuse phase change memory array and other circuitry.

FIG. 8 is a simplified block diagram of an integrated circuit according to an embodiment of the present invention. The integrated circuit 74 includes a memory array 60 implemented using thin film fuse phase change memory cells, on a semiconductor substrate. A row decoder 61 is coupled to a plurality of word lines 62, and arranged along rows in the memory array 60. A column decoder 63 is coupled to a plurality of bit lines 64 arranged along columns in the memory array 60 for reading and programming data from the multiple-gate memory cells in the array 60. Addresses are supplied on bus 65 to column decoder 63 and row decoder 61. Sense amplifiers and data-in structures in block 66 are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry is included on the integrated circuit, such as a general purpose processor or special purpose application circuitry, or a combination of modules providing system-on-a-chip functionality supported by the thin film fuse phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages 68, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 9:
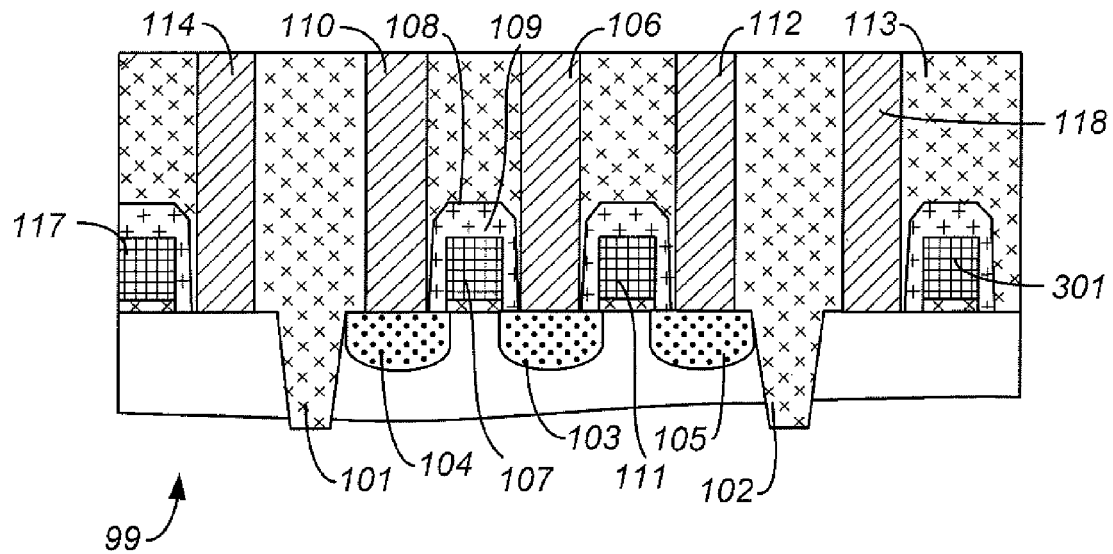
FIG. 9 is a cross-section of a substrate that includes access circuitry formed by front-end-of-line processes, made in a process for manufacturing a phase change memory device based on the structure shown in FIG. 5.

FIG. 9 illustrates a structure 99 after front-end-of-line processing, forming commonly used CMOS components in the illustrated embodiment corresponding to the word lines, the source line, and the access transistors in the array shown in FIG. 7. In FIG. 9, source line 106 overlies doped region 103 in the semiconductor substrate, where the doped region 103 corresponds with the source terminal of a first access transistor on the left in the figure, and of a second access transistor on the right in the figure. In this embodiment, the source line 106 extends to the top surface of the structure 99. In other embodiments the source line does not extend all the way to the surface. Doped region 104 corresponds with the drain terminal of the first access transistor. A word line including polysilicon 107, and silicide cap 108, acts as the gate of the first access transistor. Dielectric layer 109 overlies the polysilicon 107 and silicide cap 108. Plug 110 contacts doped region 104, and provides a conductive path to the surface of the structure 99 for contact to a memory cell electrode as described below. The drain terminal of the second access transistor is provided by doped region 105. A word line including polysilicon line 111, and the silicide cap (not labeled) acts as the gate for the second access transistor. Plug 112 contacts doped region 105 and provides a conductive path to the top surface of the structure 99 for contact to a memory cell electrode as described below. Isolation trenches 101 and 102 separate the two-transistor structure coupled to the plugs 110 and 112, from adjacent two-transistor structures. On the left, word line polysilicon 117 and plug 114 are shown. On the right, word line polysilicon 118 and plug 113 are shown. The structure 99 illustrated in FIG. 9 provides a substrate for formation of memory cell components, including the first and second electrodes, and the bridge of memory material, as described in more detail below.

Figure 10:
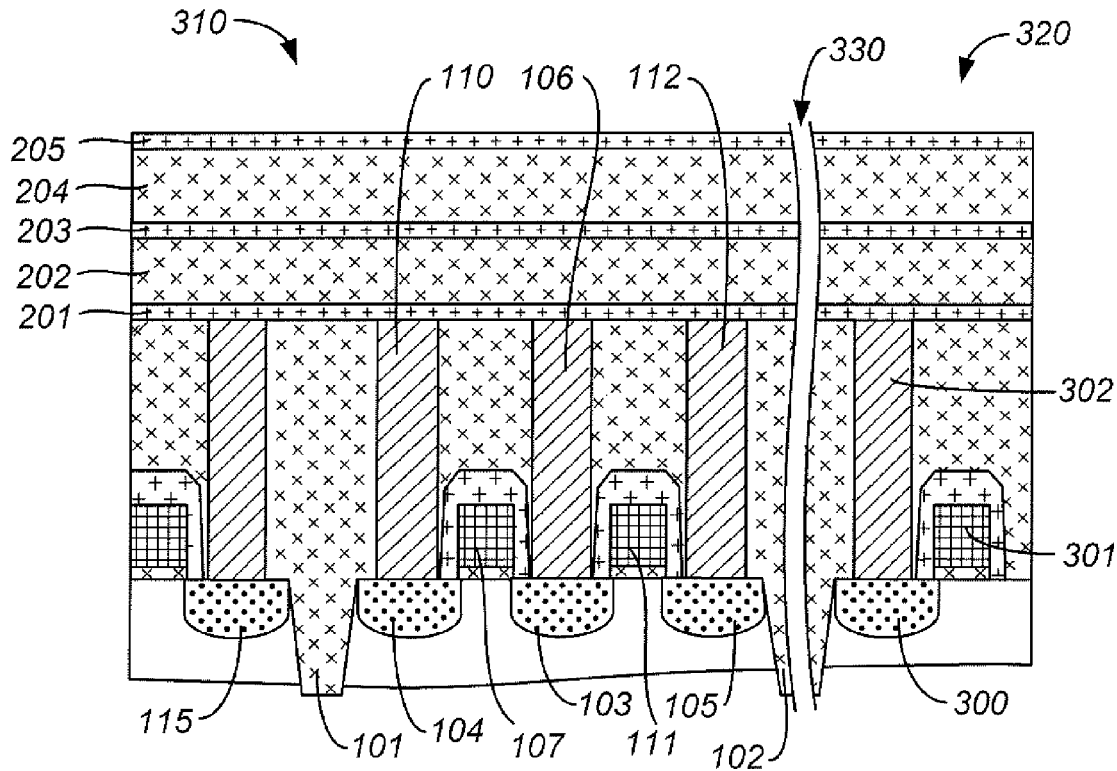
FIGS. 10-18 illustrate a device and stages in manufacturing methods for a memory device, using the electrode layer based on multilayer insulators.

FIGS. 10-18 illustrate, in phase change, bridge devices and stages in manufacturing of the devices using an electrode layer implemented with multi-layer dielectric. FIG. 10 illustrates a stage in the manufacturing process after formation of a multilayer dielectric fill. FIG. 10 shows an array region 310 and a peripheral region 320 separated by the cutaway 330, for the purposes of illustration of the manner in which the manufacturing steps used for formation of the memory devices integrate with formation of peripheral circuitry. This cutaway 330 is preserved throughout FIGS. 10-18. In the array region 310, the substrate on which the multilayer dielectric fill is formed includes an array of contacts defined by the top surfaces of the conductive plugs 110, 112 and other similar plugs on the device. These contacts are used for access to the memory cells as described below. The multilayer dielectric fill in this embodiment includes a bottom etch stop layer 201, a first dielectric fill layer 202, a second etch stop layer 203, a second dielectric fill layer 204 and a protective layer 205 over the second dielectric fill layer 204. In a representative embodiment, the bottom etch stop layer 201, the second etch stop layer 203 and a protective layer 205 comprises silicon nitride, while the first and second dielectric fill layers 202, 204 comprised silicon dioxide. The materials used for the layers 201-205 in the multilayer dielectric fill can be selected as desired for compatibility with the manufacturing steps described below. Also, embodiments may eliminate the bottom etch stop layer 201 and a protective layer 205, if not necessary given the materials chosen in the manufacturing steps described below.

Figure 11:
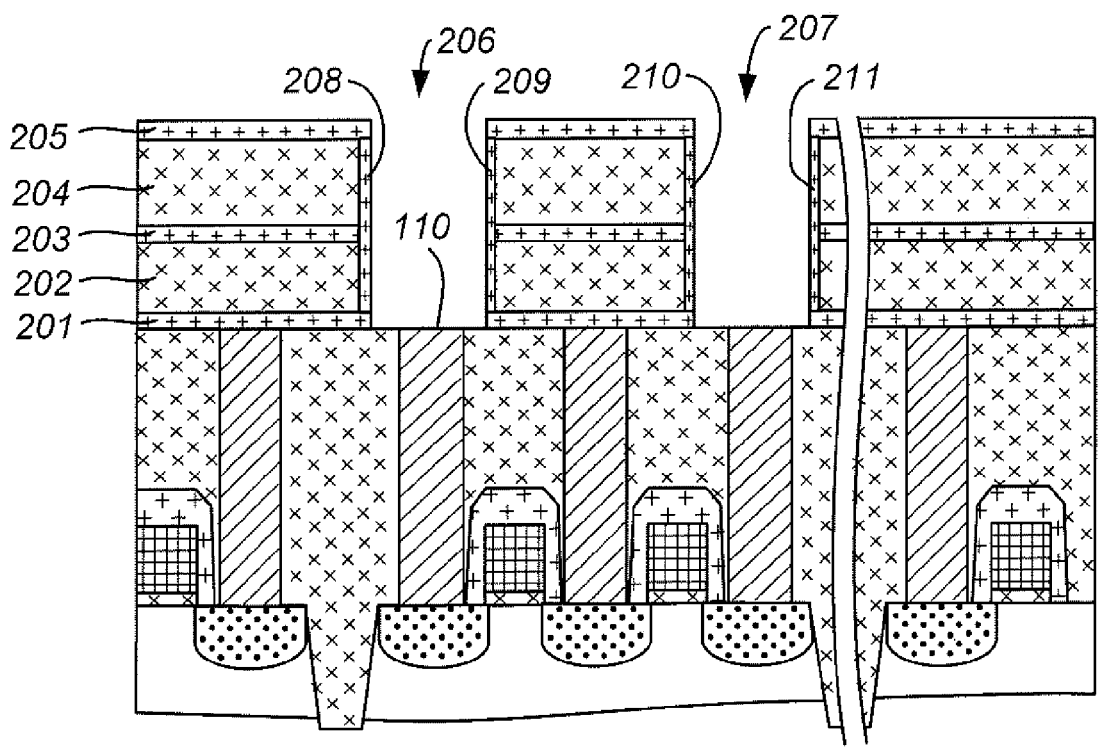

FIG. 11 illustrates a next stage in the manufacturing process. This stage occurs after a photolithography step defining openings for contact to the array of contacts in the substrate, and aligned with the contacts 110, 112. An etch process or processes (for example $CF_X$ ro $C_XF_Y$ based reactive ion etching for silicon dioxide and silicon nitride materials) is/are applied within the openings to remove all the layers 201-205 of the multilayer fill in the trenches 206, 207, and to expose the top surfaces of the contacts, including top surface 210 of the contact plug 110. In this embodiment, the bottom etch stop layer 201 is used for the purposes of preventing over-etch into dielectric fill surrounding the conductive plug 110. In other embodiments, if such over-etch is not likely to occur, then the bottom etch stop layer might be eliminated.

After etching the trenches 206, 207, a dielectric layer is conformally deposited over the structure, and anisotropically etched to defined sidewall structures 208, 209 in the trench 206, and sidewall structures 210, 211 in the trench 207. In the illustrated embodiment, the sidewall structures 208-211 comprise silicon nitride. Representative thicknesses of the sidewall structures range from about 30 to 50 nanometers. In some embodiments, it may be preferable that even thinner sidewall structures if possible considering the manufacturing processes utilized for the structures described herein or surrounding structures. Other materials, which comprise good electrical insulators in thin films, and which can be selectively etched in the manufacturing processes described below could be utilized.

Figure 12:
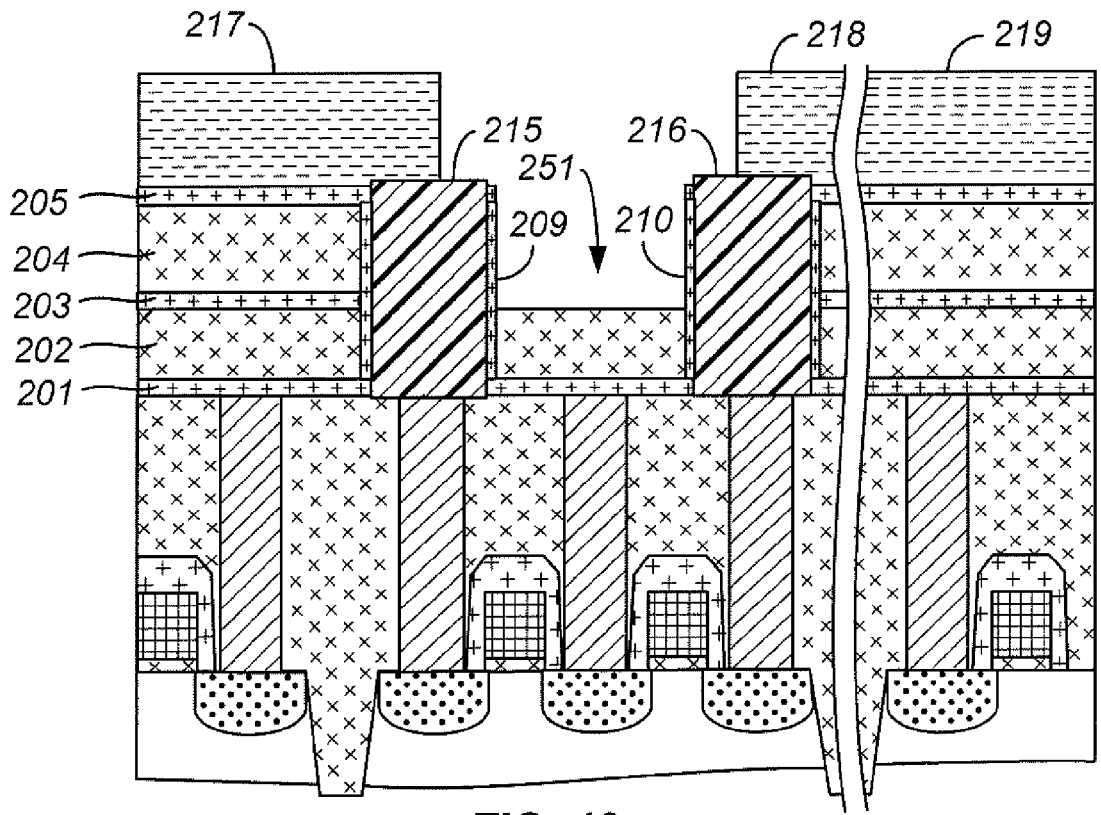

FIG. 12 illustrates a next stage in the manufacturing process. This stage occurs after performing deposition of a sacrificial material 215 like a polymer material used as a bottom antireflective coating BARC (similar to photoresist materials), or other material which has good selectivity for etching relative to the materials of the sidewall structures 208-211, the dielectric fill layer 204, and the etch stop layer 203. After deposition of the sacrificial material 215, a photoresist 217, 218, 219 is applied and patterned to define openings uncovering electrode regions (such as trench 251) and sidewall spacers 209, 210. The sacrificial material 215 is etched back using a chlorine and oxygen gas based wet/dry etch process, stopping on the top of the multilayer fill, such as on a top protective layer 205, or on the top of the second dielectric fill layer 204. Next, an etch is applied to remove the protective layer 205, and the second dielectric fill layer 204 within the openings, exposing the sidewall spacers 209, 210 within the trench 251.

Figure 13:
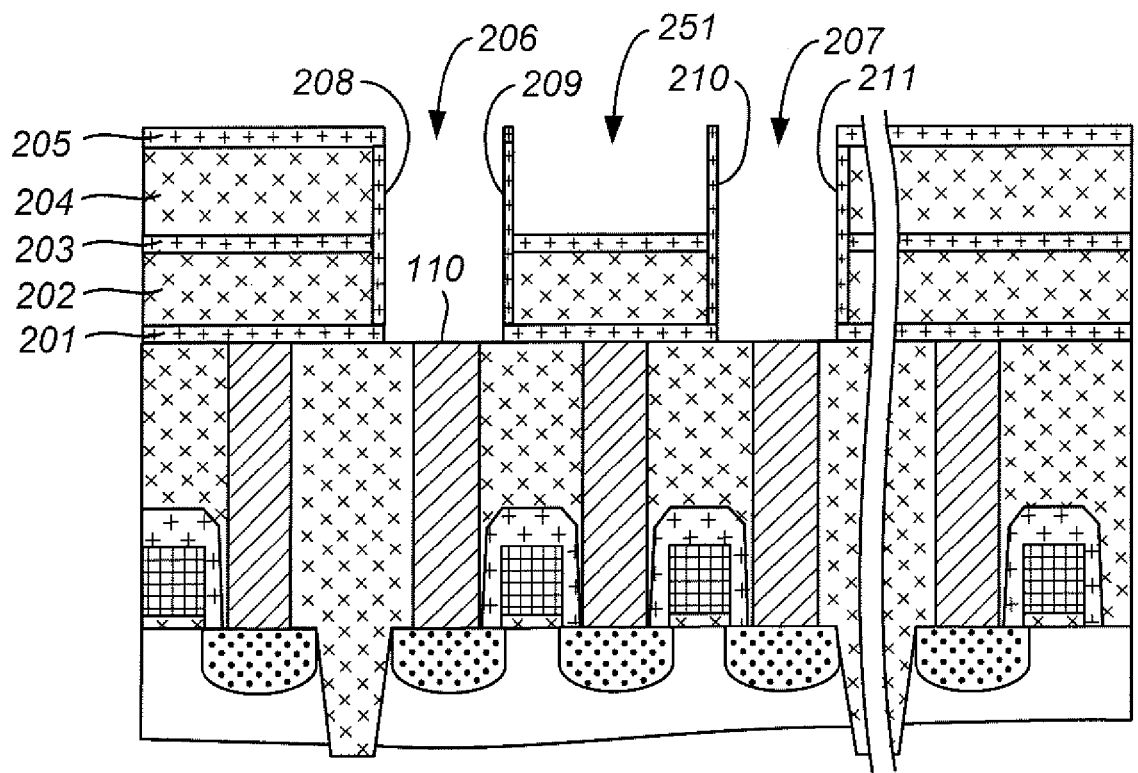

FIG. 13 illustrates a next stage, after a dry/wet strip is applied, such as a dry strip using oxygen ashing followed by a wet strip applying EKC265 etch chemistry, or other chemistry commonly utilized for removal of such material after formation of the patterns for vias using photoresist, to remove the photoresist 217, 218, 219 and the sacrificial material 215, 216, where the sacrificial material comprises a polymer similar to photoresist that is etched in the same way. The resulting structure includes the trenches 206 and 207 for first electrode contacts to the underlying access structures including the top surface 210 of the conductive plug 110, and the trench 251 for a second electrode contact, with sidewall structures 209, 210 standing between them.

Figure 14:
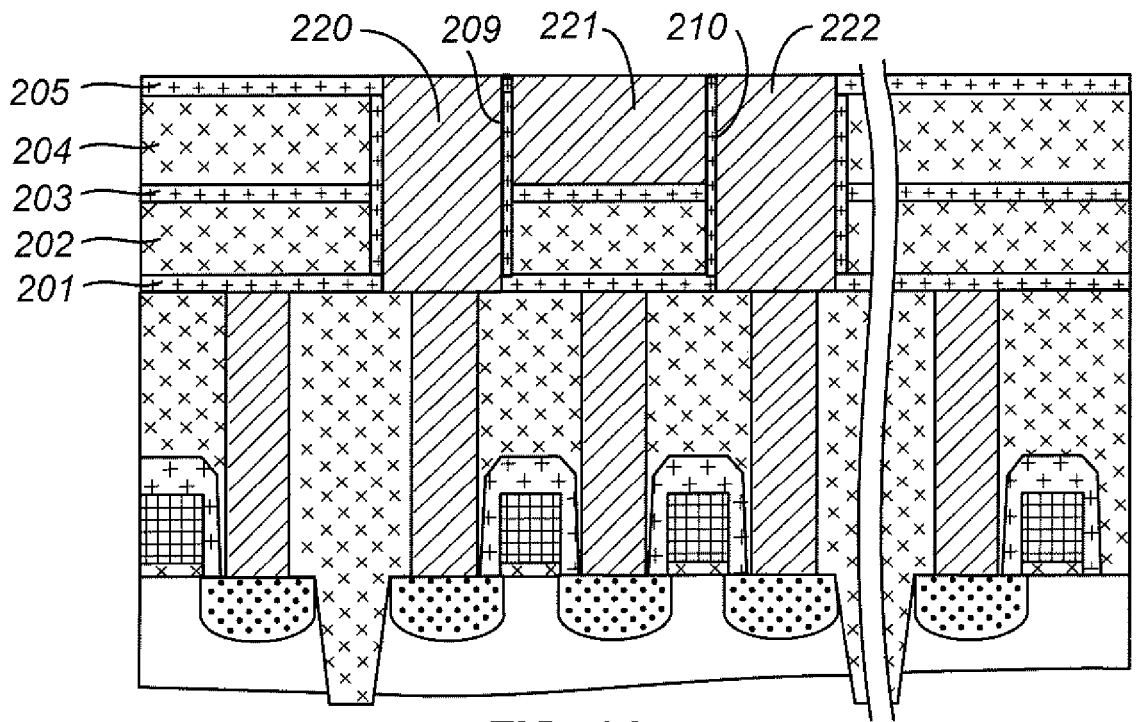

FIG. 14 shows results of a procedure to fill conductive material into the trenches 206, 207, 251. For example, commonly applied copper or copper alloy metallization can be utilized as applied for filling small vias with conductive material. The technique applied can be the same as used for metallization layers as described below, to improve scalability of the process as critical dimensions for the metallization processes shrink. Examples of alternative approaches include tungsten or aluminum metallization. After deposition of a conductive material and etchback or chemical mechanical polishing technique is applied to planarize the structure leaving conductive members 220, 221, 222 separated by the sidewall structures 209, 210. The protective layer 205 in the multilayer dielectric fill is utilized in the case of copper metallization to prevent copper diffusion into the structure. For other metallization techniques, the protective layer 205 might be eliminated. Processes for deposition of copper include electrochemical, mechanical deposition techniques using technology available from NuTool, Inc of Milpitas, Calif.

Figure 15:
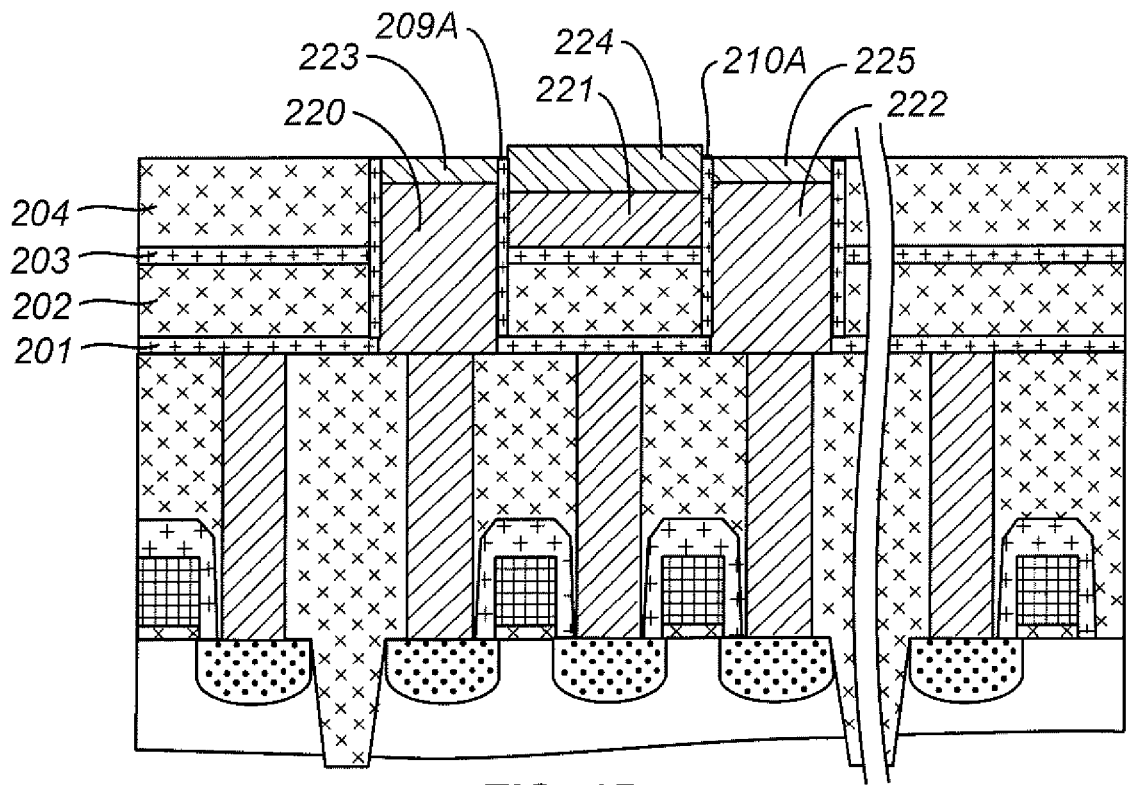

FIG. 15 illustrates a next stage, after applying a procedure to remove a portion of the conductive material near the surface. For example, when the conductive material comprises copper, a wet the process can be utilized remove 10 to 50 nanometers for example of the top surface of the material, leaving the sidewall structures 209, 210 protruding from the resulting surface. The copper can be etched back using highly, chemical low stress electrochemical polishing or electrochemical mechanical deposition (ECMD) leaving recesses in the trenches. For, example, in a first stage Cu (copper) is removed (by planarization), in which the end-point signal is generated by detecting the oxide layer 204, or if present the SiN layer 205. Then, in a second stage, after changing to different recipe, slurry or polish head with higher selectivity of Copper to Oxide or SiN, the copper within the via is etched selectively to "dish" the copper in the via.

Next, electrode material such as TaN or TiN is deposited to fill the recesses formed by the etchback. The electrode material is selected for compatibility with the programmable resistive memory material, and to act as a diffusion barrier between the conductive material and a phase change material. Alternatively, the electrode material may be TiAlN or TaAlN, or may comprise, for further examples, one or more elements selected from the group consisting of Ti, W, Mo, Al, Ta, Cu, Pt, Ir, La, Ni, and Ru and alloys thereof. After deposition of the electrode material, the structures planarized by chemical mechanical polishing or otherwise removing the protective layer 205, if necessary, and exposing top surfaces 209A and 210A of the sidewall structures 209, 210. Resulting top electrode members include thin films 223, 224, 225 of the electrode material, separated by the sidewall structures 209, 210.

Figure 16:
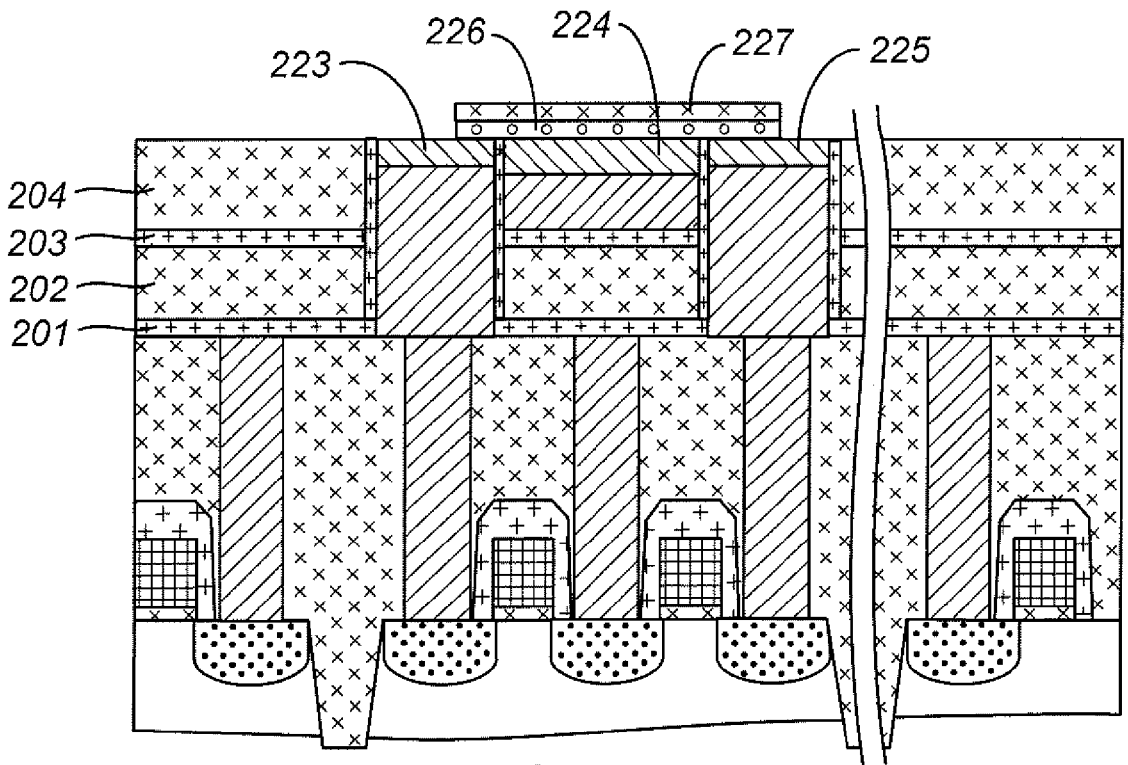

FIG. 16 illustrates a next stage in the process after a thin film of programmable resistive material followed by a thin film of protective material, such as silicon nitride, are deposited and patterned to define a bridge 226 of programmable resistive material covered by a patch 227 of material which protects the programmable resistive material from etch chemistries in following steps. The bridge 226 in this example is utilized for two memory cells and at this stage extends from the first electrode member 223 on the left of a first memory cell to the first electrode member 225 on the right of a second memory cell, across the second electrode member 224 which is shared between the first and second cell. The bridge 226 may be patterned using one or more a conventional photolithographic steps to define a rectangular patch. Techniques may be applied, such as photoresist trimming to reduce the width of the patch. Representative techniques for reducing the width of the patch are described in copending U.S. patent application Ser. No. 11/155,067, incorporated by reference above.

Figure 17:
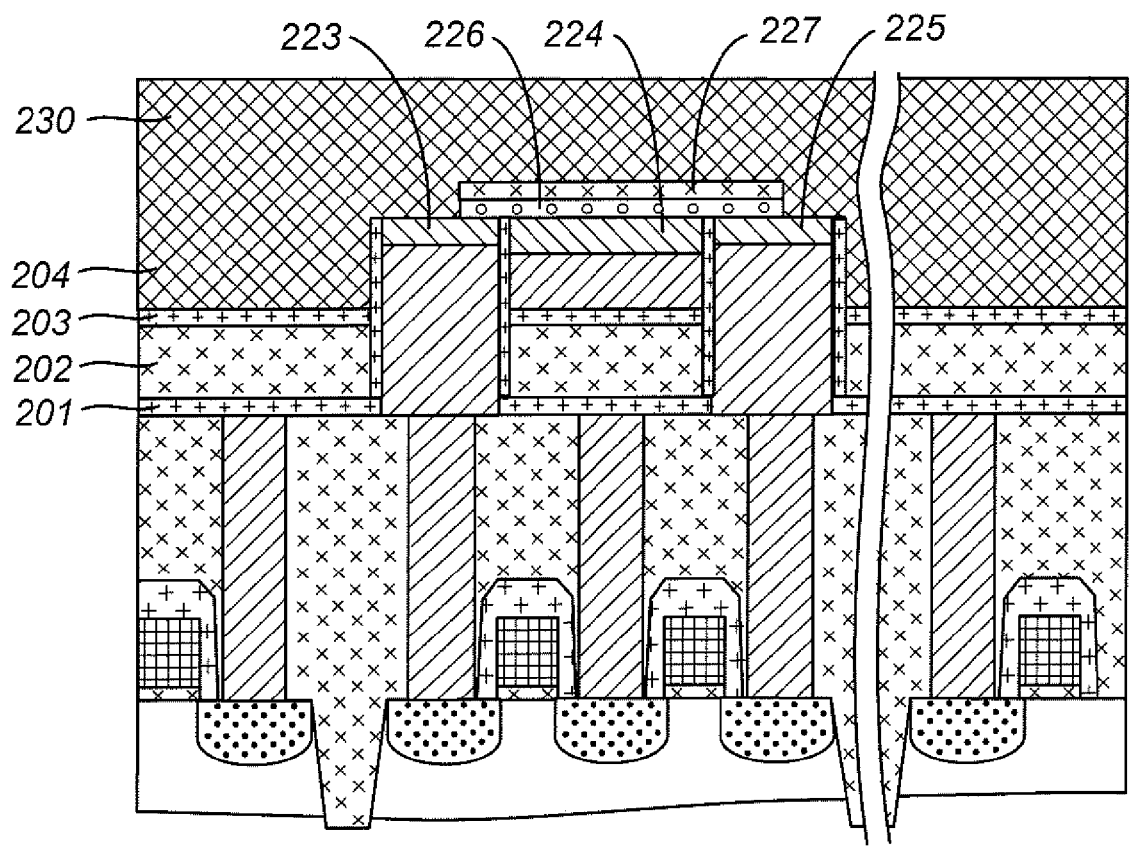
Figure 18:
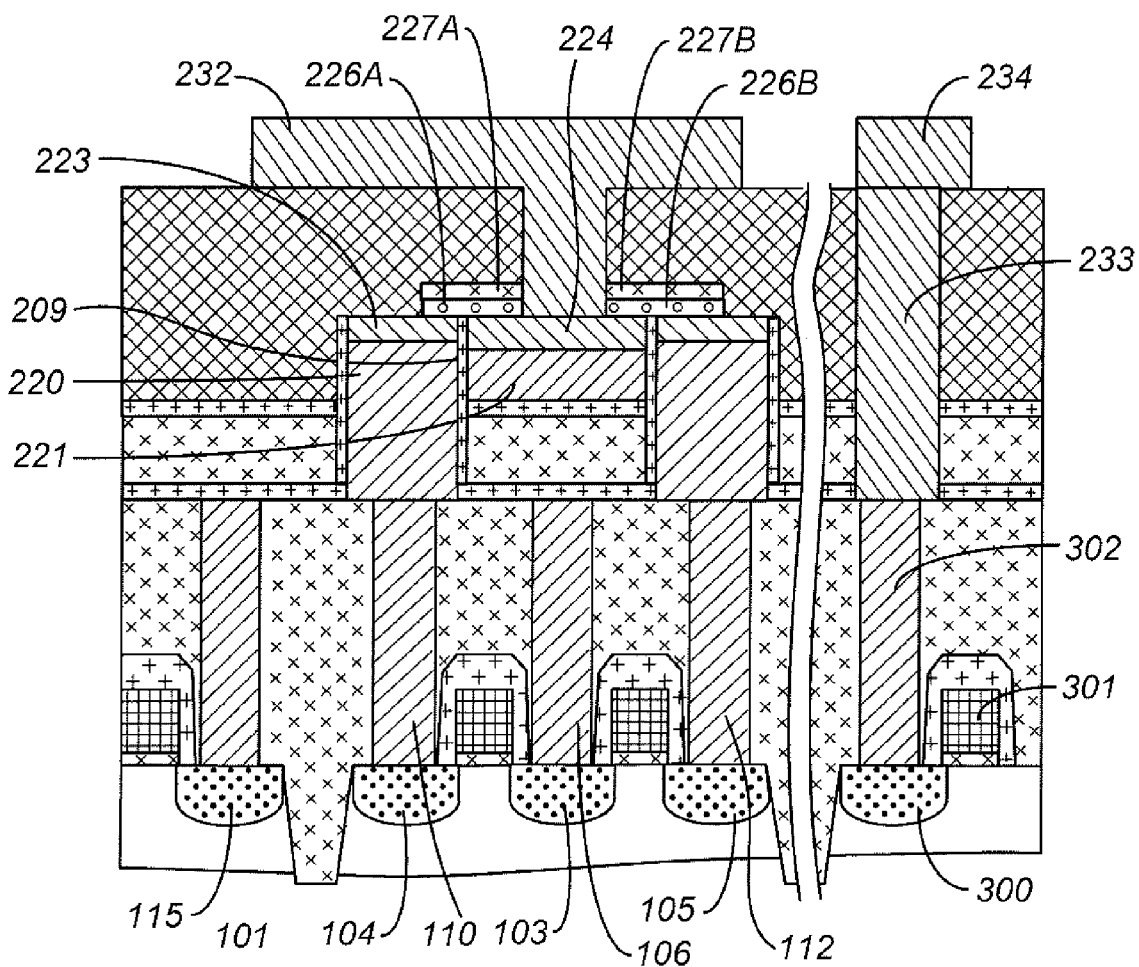

FIG. 17 illustrates the structure after deposition of an inter-metal dielectric 230 over the memory cell structure in a array area and in the peripheral area. As shown in FIG. 18, a photolithographic step is applied to open a via to the electrode member 224, followed by a conductive fill, such as a copper fill and chemical mechanical polishing to form a plug, or ECMP as described above. Ni embodiments of the process, a copper alloy damascene metallization process is used in which the patterned conductive layer is formed depositing fluorosilicate glass (FSG) on the exposed surface, and then forming a photoresist pattern in the pattern desired. An etch is applied removing exposed FSG, and then liner and seed layers are deposited in the pattern. Then, copper plating is applied to fill the pattern. After plating, an anneal step is applied, followed by a polishing process. After formation of a plug contacting the electrode member 224, the patch 226 is divided into a thin film bridge 226A, 227A on the left crossing the dielectric sidewall structure 209, and a thin film bridge 226B, 227B on the right crossing the dielectric sidewall structure 210. After the chemical mechanical polishing, a patterned conductive layer is defined, including bit lines 232 in the array region, and other metallization 233, 234 in the peripheral region.

The resulting device operates by a current path from the bit line 223 through the electrode member 224 and the thin film bridge 226A, to the electrode member 223, 220, into the conductive plug 110, and on through the access structures below to the common source line 106. When the programmable resistive material comprises a phase change material such as GST, the memory cell stores one bit, such as a logical zero when the phase change material is in the amorphous state, and stores another bit, such as logical one when the phase change material is in the polycrystalline state.

The process steps described herein are easily integrated with standard CMOS manufacturing technologies, and scales well with reducing critical dimensions for a metallization, particularly as the metallization used for the fill-in steps in formation of the electrode members 220, 221, 222 matches the metallization used in the upper layers, such as copper metallization for bit lines 232. The thin films of electrode material, including 223, 224, 225 can be deposited using techniques that need not work as well for filling high aspect ratio vias as the metallization technologies developed for inter-metal layer contacts between metal layers in multilayer metallization technologies.

A cell described herein comprises two bottom electrodes with a dielectric spacer in between and a bridge of phase change material on the top of the electrodes spanning across the spacer. The bottom electrodes and dielectric spacer are formed in an electrode layer over front-end-of-line CMOS logic structures or other function circuit structures, providing a structure that easily support embedded memory and function circuits on a single chip, such as chips referred to as system on a chip SOC devices.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A method for manufacturing a memory device, comprising:
    forming a circuitry in a substrate having a top surface, the circuitry including an array of contacts on the top surface of the substrate;
    forming an electrode layer on the substrate, the electrode layer having a top surface, the electrode layer including an array of electrode pairs, including depositing conductive first electrodes and second electrodes of the respective electrode pairs using a metallization process, and forming respective insulating members between the first and second electrodes, wherein the first electrodes contact corresponding contacts in the array of contacts, and wherein the first and second electrodes and the insulating members extend to the top surface of the electrode layer, and the insulating members have widths between the first and second electrodes at the top surface;
    forming an array of bridges of memory material on the top surface of the electrode layer, the array of bridges including bridges for each of the electrode pairs in the array of electrode pairs, contacting the respective first and second electrodes and extending across the respective insulating members, the bridges comprising patches of memory material having a first side and a second side and contacting the respective first and second electrodes on the first side, the bridges defining inter-electrode paths between the first and second electrodes across the insulating members having path lengths defined by the widths of the insulating members, wherein the memory material has at least two solid phases; and
    forming a patterned conductive layer using said metallization process over said bridge, and forming an array of contacts between said second electrodes in the array of electrode pairs and said patterned conductive layer.

2. The method of claim 1, wherein two electrode pairs in said array of electrode pairs arranged in a row, including a first filled contact via acting as a first electrode in a first of the two electrode pairs, a filled electrode trench acting as second electrodes in both of the two electrode pairs, and a second filled contact via acting as a first electrode in a second of the two electrode pairs.

3. The method of claim 1, wherein the memory material comprises a combination of Ge, Sb, and Te.

4. The method of claim 1, wherein the memory material comprises a combination of two or more materials from the group of Ge, Sb, Te, Se, In, Ti, Ga, Bi, Sn, Cu, Pd, Pb, Ag, S, and Au.

5. A method for manufacturing a memory device, comprising:
    forming a circuitry in a substrate having a top surface, the circuitry including an array of contacts on the top surface of the substrate;
    forming an electrode layer on the substrate, the electrode layer having a top surface, the electrode layer including an array of electrode pairs, including depositing conductive first electrodes and second electrodes of the respective electrode pairs using a metallization process, and forming respective insulating members between the first and second electrodes, wherein the first electrodes contact corresponding contacts in the array of contacts, and wherein the first and second electrodes and the insulating members extend to the top surface of the electrode layer, and the insulating members have widths between the first and second electrodes at the top surface;
    forming an array of bridges of memory material on the top surface of the electrode layer, the array of bridges including bridges for each of the electrode pairs in the array of electrode pairs, contacting the respective first and second electrodes and extending across the respective insulating members, the bridges comprising patches of memory material having a first side and a second side and contacting the respective first and second electrodes on the first side, the bridges defining inter-electrode paths between the first and second electrodes across the insulating members having path lengths defined by the widths of the insulating members, wherein the memory material has at least two solid phases, wherein said forming the electrode layer includes forming a multilayer structure including a first dielectric fill layer, an etchstop layer on the first dielectric fill layer, and a second dielectric fill layer on the etchstop layer;

etching the multilayer structure in a pattern including contact vias uncovering selected contacts in the array of contacts on the top surface of the substrate;

forming sidewall dielectric spacers on sidewalls of the contact vias;

covering the multilayer structure with a sacrificial material, filling the contact vias;

selectively etching the sacrificial material in a pattern including openings uncovering electrode regions and sidewall dielectric spacers on the multilayer structure, stopping near a top surface level of the second dielectric fill layer;

removing the second dielectric fill layer in the electrode regions, stopping on the etchstop layer, to form electrode trenches in the multilayer structure, and leaving the sidewall dielectric spacers on sides of the electrode trenches;

removing the sacrificial material from the contact vias, uncovering said selected contacts and leaving the sidewall dielectric spacers between pairs of openings, the pairs including contact vias and electrode trenches;

depositing a conductive material filling the contact vias and electrode trenches with the conductive material to form a filled structure using said metallization process; and forming a patterned conductive layer using said metallization process over said bridge, and forming an array of contacts between said second electrodes in the array of electrode pairs and said patterned conductive layer.

6. The method of claim 5, including forming a bottom etchstop layer in the multilayer structure, and wherein said etching the multilayer structure in a pattern including contact vias includes first etching vias stopping on the bottom etchstop layer and then etching the bottom etchstop layer within the vias stopping on the selected contacts.

7. The method of claim 5, including forming a protective layer over the second dielectric fill in the multilayer structure, and removing said protective layer after filling said electrode recesses with electrode material.

8. The method of claim 5, wherein said sacrificial material comprises an organic polymer.

9. The method of claim 5, wherein said sacrificial material comprises an antireflective material.

10. The method of claim 5, including:

etching back the conductive material within the contact vias and electrode trenches to a level below tops of the sidewall dielectric spacers to form electrode recesses;

filling the electrode recesses with an electrode material to a level exposing respective top surfaces of sidewall dielectric spacers between pairs of electrodes, where the pairs of electrodes include conductive material within respective filled contact vias acting as first electrodes and filled electrode trenches acting as second electrodes.

11. The method of claim 10, wherein said electrode material comprises a diffusion barrier between said conductive material and said programmable resistive material.

12. The method of claim 10, wherein said conductive material comprises copper.

13. The method of claim 10, wherein said electrode material comprises a conductive nitride including one or both of Ti and Ta.

14. A method for manufacturing a memory device comprising programmable resistive material, comprising:

forming circuitry in a substrate having a top surface, the circuitry including an array of contacts on the top surface of the substrate;

forming a multilayer structure including a first dielectric fill layer, an etchstop layer on the first dielectric fill layer, and a second dielectric fill layer on the etchstop layer;

etching the multilayer structure in a pattern including contact vias uncovering selected contacts in the array of contacts on the top surface of the substrate;

forming sidewall dielectric spacers on sidewalls of the contact vias;

covering the multilayer structure with a sacrificial material, filling the contact vias;

selectively etching the sacrificial material in a pattern including openings uncovering electrode regions and sidewall dielectric spacers on the multilayer structure, stopping near a top surface level of the second dielectric fill layer;

removing the second dielectric fill layer in the electrode regions, stopping on the etchstop layer, to form electrode trenches in the multilayer structure, and leaving the sidewall dielectric spacers on sides of the electrode trenches;

removing the sacrificial material from the contact vias, uncovering said selected contacts and leaving the sidewall dielectric spacers between pairs of openings, the pairs including contact vias and electrode trenches;

depositing a conductive material filling the contact vias and electrode trenches with the conductive material to form a filled structure;

etching back the conductive material within the contact vias and electrode trenches to a level below tops of the sidewall dielectric spacers to form electrode recesses;

filling the electrode recesses with an electrode material selected for compatibility with the programmable resistive material to a level exposing respective top surfaces of sidewall dielectric spacers between pairs of electrodes, where the pairs of electrodes include conductive material within respective filled contact vias acting as first electrodes and filled electrode trenches acting as second electrodes, and providing a top surface of an electrode layer including an array of electrode pairs;

forming an array of bridges of programmable resistive material on the top surface of the electrode layer, the array of bridges including bridges for electrode pairs in the array of electrode pairs, contacting the respective first and second electrodes and extending across the respective top surfaces of sidewall dielectric spacers, the bridges defining inter-electrode paths between the first and second electrodes across the insulating members having path lengths defined by the widths of the insulating members; and forming a patterned conductive layer over said bridges in electrical communication with said second electrodes in the array of electrode pairs.

15. The method of claim 14, including forming a bottom etchstop layer in the multilayer structure, and wherein said etching the multilayer structure in a pattern including contact vias includes first etching vias stopping on the bottom etchstop layer and then etching the bottom etchstop layer within the vias stopping on the selected contacts.

16. The method of claim 14, including forming a protective layer over the second dielectric fill in the multilayer structure, and removing said protective layer after filling said electrode recesses with electrode material.

17. The method of claim 14, wherein said sacrificial material comprises an organic polymer.

18. The method of claim 14, wherein said sacrificial material comprises an antireflective material.

19. The method of claim 14, wherein said conductive material comprises copper.

20. The method of claim 14, wherein said electrode material comprises a diffusion barrier between said conductive material and said programmable resistive material.

21. The method of claim 14, wherein said electrode material a conductive nitride including one or both of Ti and Ta.

22. The method of claim 14, wherein said circuitry includes a plurality of word lines and isolation devices controlled by signals on the plurality of word lines, and said patterned conductive layer comprises a plurality of bit lines.

23. The method of claim 14, wherein two electrode pairs in said array of electrode pairs arranged in a row, including a first filled contact via acting as a first electrode in a first of the two electrode pairs, a filled electrode trench acting as second electrodes in both of the two electrode pairs, and a second filled contact via acting as a first electrode in a second of the two electrode pairs.

24. The method of claim 14, wherein the memory material comprises a combination of Ge, Sb, and Te.

25. The method of claim 14, wherein the memory material comprises a combination of two or more materials from the group of Ge, Sb, Te, Se, In, Ti, Ga, Bi, Sn, Cu, Pd, Pb, Ag, S, and Au.

* * * * *

UNITED STATES PATENT AND TRADEMARK OFFICE
CERTIFICATE OF CORRECTION

PATENT NO.        : 7,605,079 B2
APPLICATION NO.   : 11/382799
DATED             : October 20, 2009
INVENTOR(S)       : Lai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 616 days.

Signed and Sealed this

Fifth Day of October, 2010

David J. Kappos
*Director of the United States Patent and Trademark Office*